United States Patent
Chen et al.

[11] Patent Number: 5,811,314
[45] Date of Patent: Sep. 22, 1998

[54] MAGNETIC INK AND METHOD FOR MANUFACTURING AND SIFTING OUT OF DEFECTIVE DICE BY USING THE SAME

[75] Inventors: Yi-Ching Chen; Hahnjong Hsiung, both of Taipei, Taiwan; William J. Nelson, North Port, N.Y.; Christopher M. Knowles, Taipai, Taiwan

[73] Assignee: General Instrument of Taiwan, Ltd., Taipei, Taiwan

[21] Appl. No.: 660,135

[22] Filed: Jun. 7, 1996

[51] Int. Cl.$^6$ .......................... H01L 21/302; H01L 21/66; H01L 21/463; G01R 31/26

[52] U.S. Cl. .................................. 437/8; 437/226

[58] Field of Search .......................... 437/8, 226

[56] References Cited

U.S. PATENT DOCUMENTS

| | | |
|---|---|---|
| 3,507,389 | 4/1970 | Casner et al. . |
| 3,572,400 | 3/1971 | Casner et al. . |
| 3,583,561 | 6/1971 | Wiesler ........................................ 437/8 |
| 3,623,603 | 11/1971 | Casner et al. . |
| 3,692,168 | 9/1972 | Hughes, Jr. et al. . |
| 3,863,764 | 2/1975 | Myslinski et al. ........................... 437/8 |
| 4,071,944 | 2/1978 | Chuss et al. ................................ 437/8 |
| 4,472,218 | 9/1984 | Avedissian et al. ......................... 437/8 |

*Primary Examiner*—John Niebling
*Assistant Examiner*—Brian K. Dutton
*Attorney, Agent, or Firm*—Volpe and Koenig, P.C.

[57] ABSTRACT

A method for dice manufacturing and sifting out of defective dice by using a magnet includes the following steps: applying magnetic ink onto defective dice; hardening to ink dot on said defective dice; removing the adhesive tape from the dice; removing defective dice through the use of the magnet. Said ink preferably comprises approximately 60%–95% percentage by weight ferromagnetic powder and 40%–5% percentage by weight thermoset resin. By using the magnetic ink and the magnetic separation method, the automation of dice manufacturing can be improved and thereby productivity is increased.

6 Claims, 5 Drawing Sheets

MAGNETIC INK AND METHOD FOR MANUFACTURING AND SIFTING OUT OF DEFECTIVE DICE BY USING THE SAME

BACKGROUND OF THE INVENTION

The present invention relates to a method to use magnetic ink for dice manufacturing and sifting out of defective dice, particularity to a method for manufacturing dice by using magnetic ink comprising ferromagnetic powder and thermoset resin.

The ordinary method of manufacturing of dice from wafers is shown in FIGS. 1 and 2. An adhesive tape is applied to the bottom of a wafer (step 10) to position the wafer. A cutting apparatus is used to cut a wafer 1 into square dice 2 (step 20). Any dice on the periphery and not having the shape of a square are removed manually (step 30). The adhesive tape is removed (step 40) to demount the wafer. After the tests through an EA sorter, the defective dice are discarded (step 50). This known method of dice manufacturing requires a lot of human resources and time. Also, the tests of the EA sorter are slow and chipping of the dice can easily occur. Therefore, improvements are needed.

SUMMARY OF THE INVENTION

The main object of the present invention is to provide a method to use magnetic ink for dice manufacturing and sifting out of defective dice.

The other object of the present invention is to provide a type of magnetic ink comprising a mixture of ferromagnetic material and thermoset resin.

The magnetic ink should include approximately 60%–95% percentage by weight ferromagnetic powder and 40%–5% percentage by weight epoxy resin. The ferromagnetic material can be any ferromagnetic powder including but not limited to the following: Cobalt, Nickel, Gadolinium and the respective alloy powders. Furthermore, the shape of said ferromagnetic powder is not limited to spherical.

In addition, the subject inventive method includes the cutting of a wafer into a plurality of dice of predetermined shape and elimination defective dice through a magnetic separation method.. The steps of this method are: (a) applying the magnetic ink to the dice on the periphery of the wafer that are not of pre-determined shape; (b) testing the electrical characteristics of the dice and applying the magnetic ink to the defective dice; (c) hardening the ink; (d) demounting the wafer; and (e) removing the defective dice with the magnetic ink by the use of a magnet.

These and other objects, advantages and features of the present invention will be more fully understood and appreciated by reference to the drawings.

Brief Description of the Reference Numerals

1: Wafer;
2: Dice

DETAILED DESCRIPTION OF THE INVENTION

Figure 1:
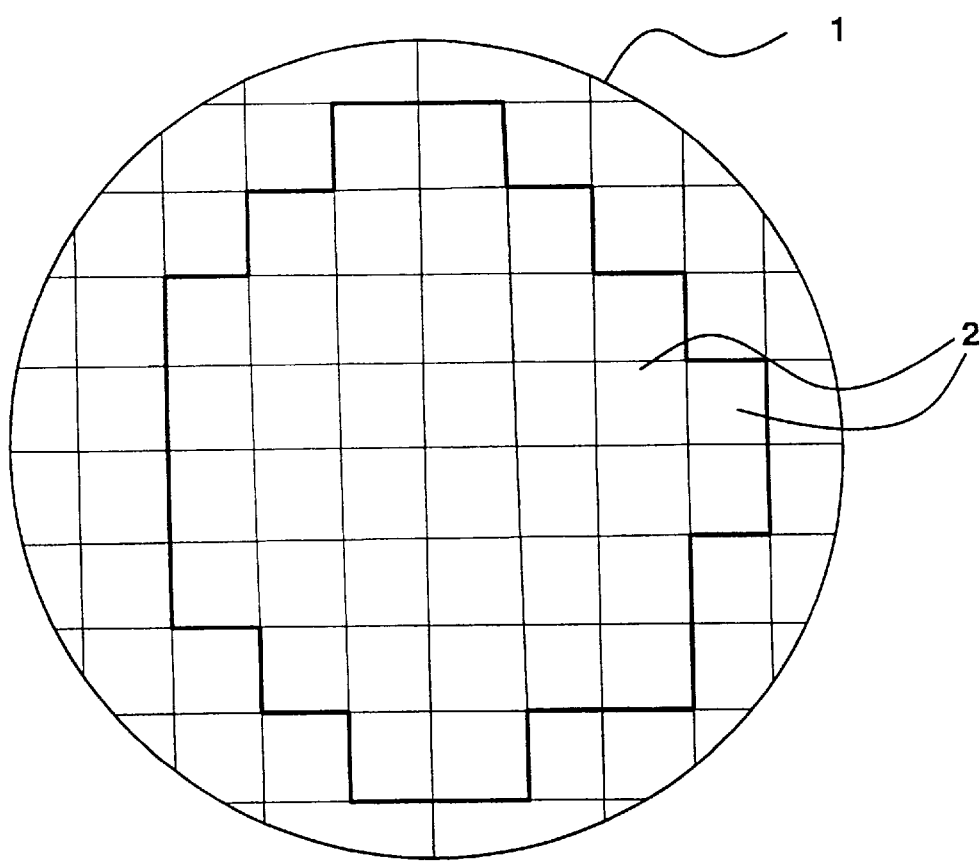
FIG. 1 depicts a wafer having a plurality of dice after being cut.
Figure 2:
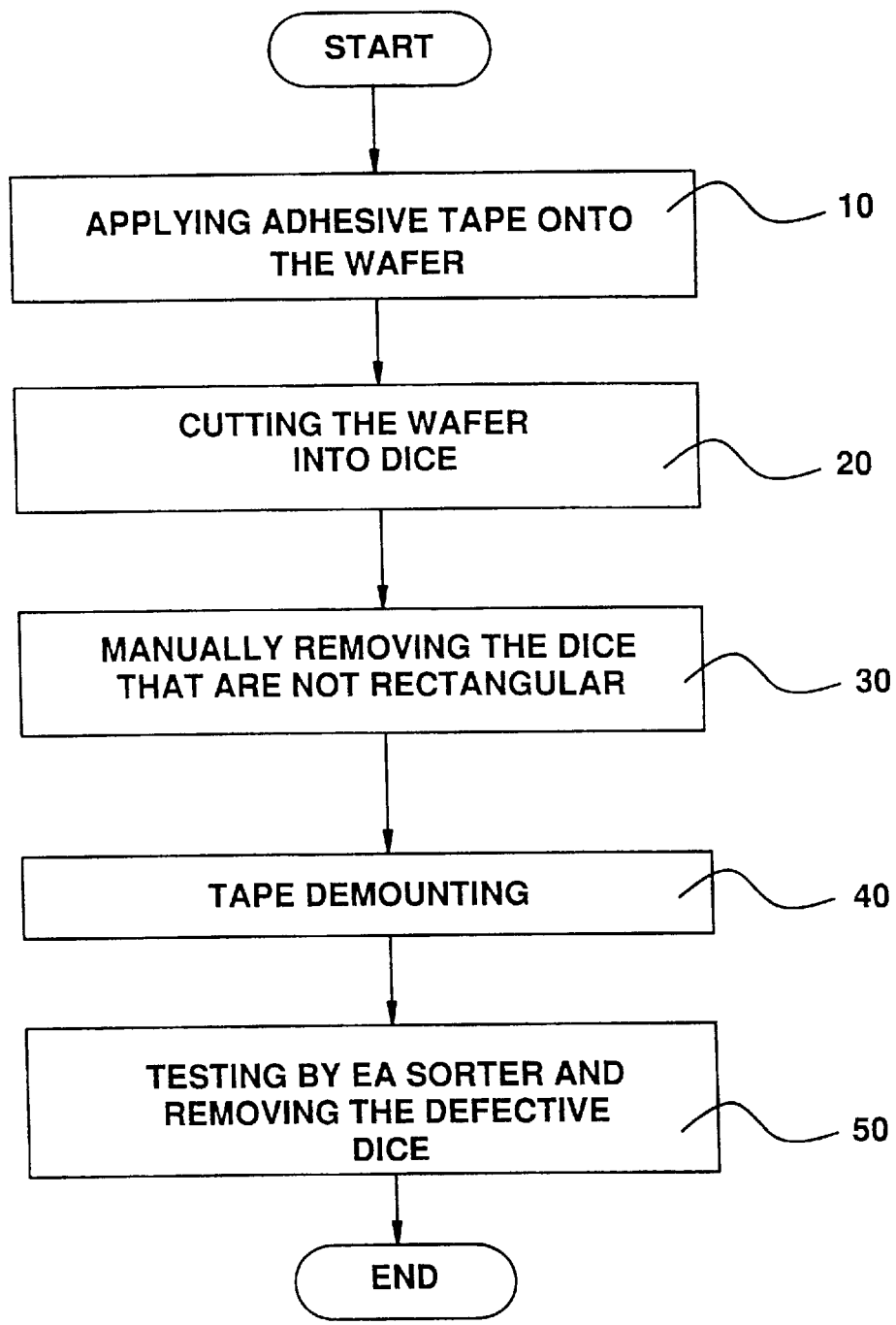
FIG. 2 is the flowchart of a known method of dice manufacturing.
Figure 3:
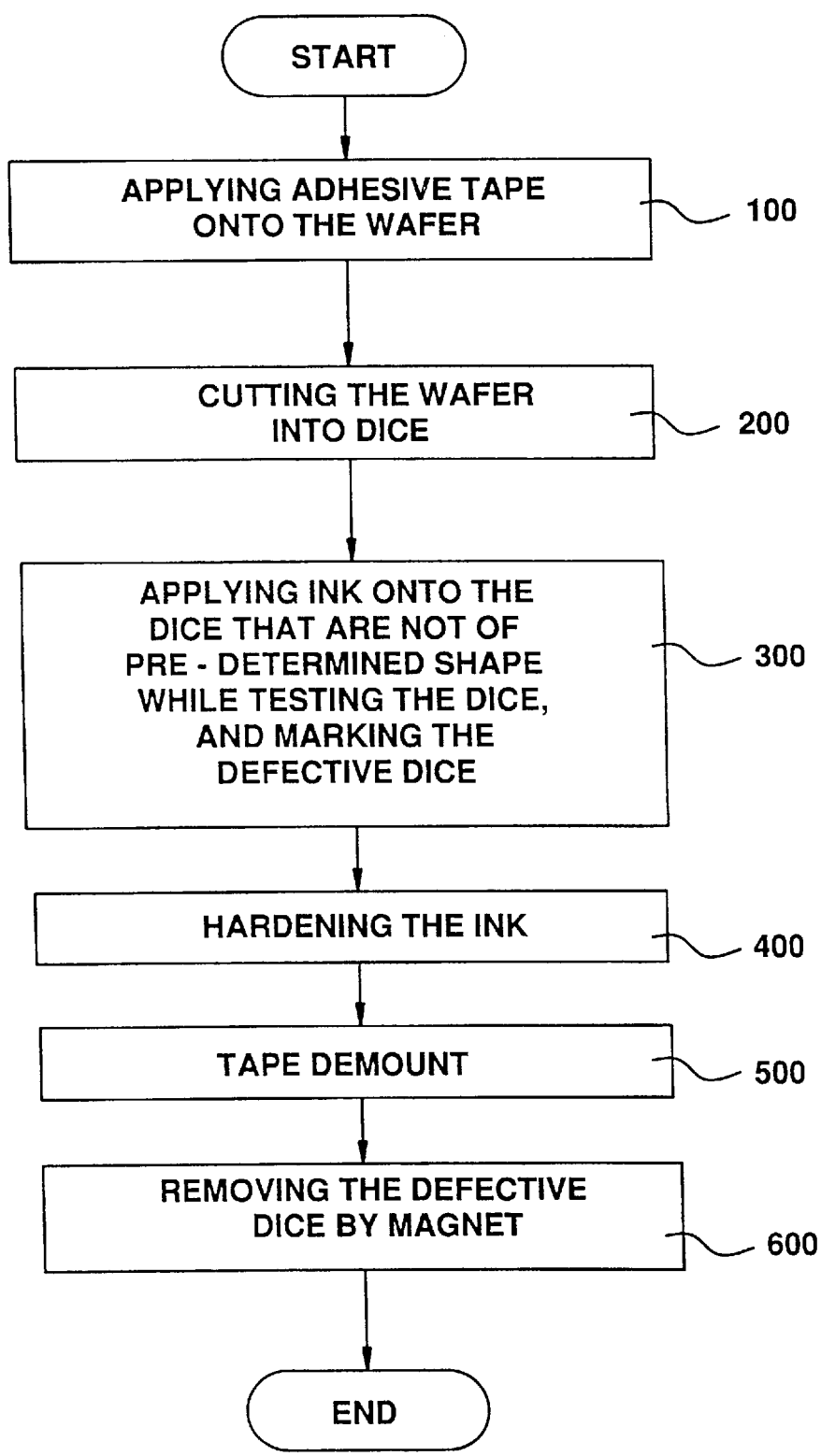
FIG. 3 is the flowchart of the present invention.

Please refer to FIG. 3, the differences between the subject method and the known method are: for a wafer having dice while applying ink onto the dice that are not of a predetermined or selected shape, a test pen containing the magnetic ink is used to test the electrical characteristics of each dice and at the same time, apply the magnetic ink onto defective dice (step 300). Afterwards, high temperature is applied to harden the ink (step 400). Then, the adhesive tape at the back of the wafer is removed (step 500), and the dice are released and collected on a plate. Finally, magnetic separation is used to remove the defective dice.

The magnetic ink of the present invention is comprised of approximately 20%–95%, preferably 60%–95%, percentage by weight of ferromagnetic material, including but not limited to Iron, $Fe_3O_4$, Cobalt, Nickel, Gadolinium and the respective alloy materials, which are ground into powder form, and mixed with approximately 80%–5 %, preferably 40%–5%, percentage by weight of thermoset resin. The size and shape of the powder will affect the viscosity and magnetic filler content of the ink. Generally, the friction among spherical high tap density powders is small and the ink flows better, and the viscosity is correspondingly decreased. Powder of smaller size will have high tap density. The thermoset resin in the ink can be of thermosetting or ultraviolet harden type. Thermoset resin preferably is stable under room temperature and quickly reacts after application of heat. The ultraviolet harden type, on the other hand, also preferably is stable under room temperature. The thermoset resin used in the following examples 1 and 2 is a liquid thermoset epoxy resin with a gel time of approximately 53 seconds at 120 degrees Celsius, 12 seconds at 150 degrees Celsius, and 4 seconds at 180 degrees Celsius.

EXAMPLES 1 and 2

In order to obtain the relationships among the ink drop size, the dimension of the dice, magnetic force of the magnet, and the distance between the dice and the magnet, experiments are conducts and the results are presented in the following Chart 1 and Chart 2 for Example 1 and 2 respectively. The dimension of the dice for Chart 1 is 1.25×1.25 $mm^2$, and 4.1×4.1$mm^2$ for Chart 2.

In these two examples, the magnetic ink comprised of 65% percentage by weight of Iron powder and 35% epoxy resin. The density of the Iron powder was 7.54 $g/cm^3$, and the density of the epoxy resin was 1.2 $g/cm^3$, and therefore the density of the ink was 2.65 $g/cm^3$. The last value is calculated from the following: 100/(67/7.54 +35/1.2) =2.65

Chart 1

| Distance between Magnet and Dice (mm) | Magnetic Force | Diameter (mm) × Thickness (mm) of Ink | Are Dice Picked Up by Magnet |
| --- | --- | --- | --- |
| 0.1 | 914 | 0.5 × 0.5 | Yes |
| 0.3 | 852 | 0.5 × 0.5 | Yes |
| 0.5 | 773 | 0.5 × 0.5 | Yes |
| 0.7 | 670 | 0.5 × 0.5 | Yes |
| 0.8 | 647 | 0.5 × 0.5 | Yes |
| 0.9 | 584 | 0.5 × 0.5 | Yes |
| 1.0 | 542 | 0.5 × 0.5 | No |

Chart 2

| Distance between Magnet and Dice (mm) | Magnetic Force | Diameter (mm) × Thickness (mm) of Ink | Are Dice Picked Up by Magnet |
|---|---|---|---|
| 0.4 | 817 | 1.0 × 0.01 | Yes |
| 0.5 | 773 | 1.0 × 0.07 | Yes |
| 0.6 | 694 | 1.0 × 0.07 | Yes |
| 0.8 | 647 | 1.0 × 0.07 | Yes |
| 0.8 | 647 | 1.50 × 1.10 | Yes |
| 0.8 | 647 | 1.50 × 1.10 | Yes |

It can be seen from Chart 1 that when the diameter and thickness of the ink drop are both 0.5 mm, the magnetic force and the distance between the dice and the magnet are inversely proportional to each other. This is because the magnet can be viewed as a big flat plate relative to the small ink drop. When the distance between the magnet and the ink drop is 0.9 mm, the magnetic force of the magnet cannot be less than 584 Gauss in order to pick up the dice.

Figure 4:
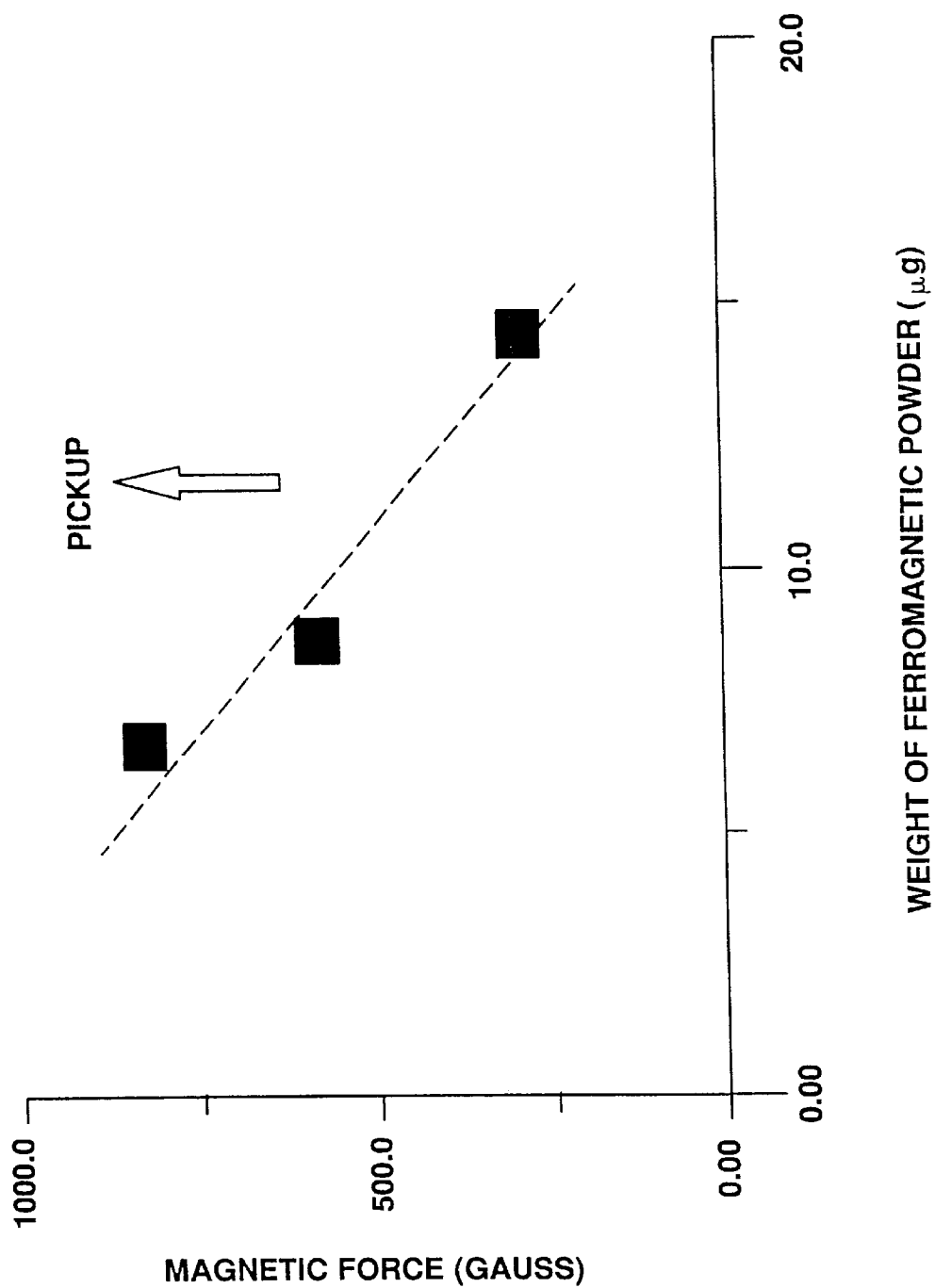
FIG. 4 depicts the relationship of the first example between the magnetic force and the concentration of the ink.
Figure 5:
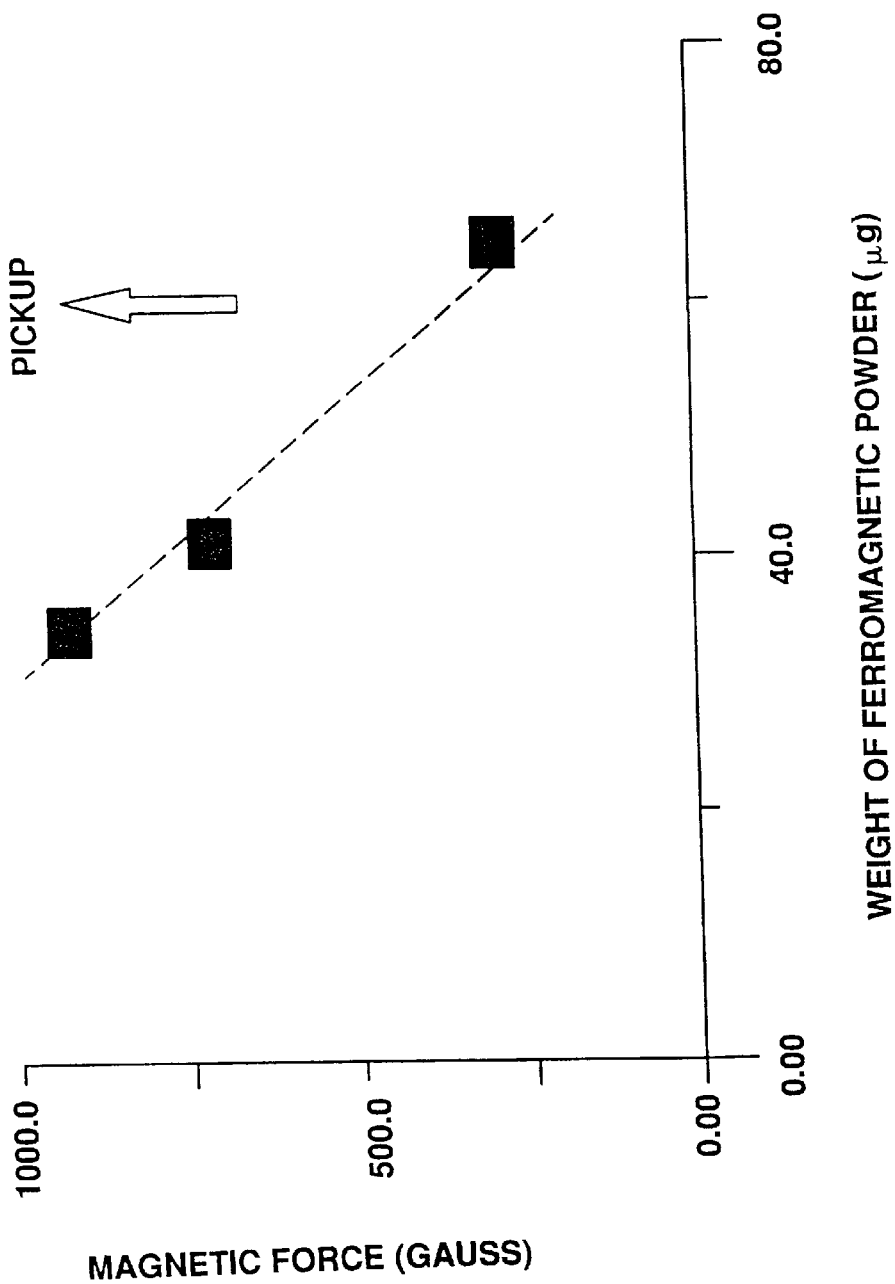
FIG. 5 depicts the relationship of the second example between the magnetic force and the concentration of said ink.

In addition, it can be seen from Chart 2 that when the distance is 0.8 mm and the magnetic force is 647 Gauss, the amount of ink must be equivalent to at least 1.5 mm in diameter and 0.1 mm in thickness. The weight of the ink can be derived from its geometric shape and density, and the amount of Iron powder can be calculated from the percentage of the Iron powder in the ink. From further experiments of using the two different sizes of dices, the force needed to attract and pick up each kind of dice, FIGS. 4 and 5 are obtained. Area above the thick dot line in each diagram means where the dice marked by the ink can be picked up by applied magnetic force. Actual operations may refer to these Figures to calculate the magnetic force and amount of ink needed.

Summarizing above, the functions of the present invention are the elimination of manual selection of defective dice and thereby saves time and human resources in addition to a great increase in the productivity of the semiconductor industry.

We claim:

1. A method of dice manufacturing, including the cutting of a positioned wafer into dice of selected shapes, comprising the steps of:
   (a) inspecting the dice;
   (b) applying magnetic ink comprising approximately 20–90 percent by weight ferromagnetic material and 80–5 percent by weight resin to the dice on the periphery of the wafer that are not of the selected shapes;
   (c) testing electrical characteristics of the dice to determine electrically defective dice;
   (d) applying said magnetic ink to the electrically defective dice;
   (e) hardening said magnetic ink;
   (f) demounting said wafer; and
   (g) removing the defective dice having said magnetic ink using a magnet.

2. The method of manufacturing dice as claimed in claim 1, in which the selected shapes are square.

3. The method of manufacturing dice as claimed in claim 1, wherein the steps of inspecting the dice and testing the electrical characteristics of the dice are per formed concurrently.

4. The method of manufacturing dice as claimed in claim 1, further comprising the step of hardening said magnetic ink with heat.

5. The method of manufacturing dice as claimed in claim 1, further comprising the step of hardening said magnetic ink with ultraviolet radiation.

6. The method of manufacturing dice as claimed in claim 1, wherein the step of applying magnetic ink comprises applying the magnetic ink comprising approximately 60–95 percent by weight ferromagnetic material and 5–40 percent by weight resin.

* * * * *

UNITED STATES PATENT AND TRADEMARK OFFICE
CERTIFICATE OF CORRECTION

PATENT NO.  : 5,811,314
DATED       : September 22, 1998
INVENTOR(S) : Chen et al.

It is certified that error appears in the above-identified patent and that said Letters Patent is hereby corrected as shown below:

In column 1, at line 39, after "into" delete "a plurality of".

In column 1, at line 40, after "elimination" insert --of--.

In column 1, at line 53, after "having" delete "a plurality of".

In column 2, at line 43, after "experiments" delete "are conducts" and insert therefor --were conducted--.

In claim 3, column 4, line 25, after "are" delete "per formed" and insert therefor --performed--.

Signed and Sealed this

Thirteenth Day of July, 1999

Q. TODD DICKINSON

Attest:

Attesting Officer

Acting Commissioner of Patents and Trademarks